United States Patent [19]
Normile et al.

[11] Patent Number: 5,623,262
[45] Date of Patent: Apr. 22, 1997

[54] MULTI-WORD VARIABLE LENGTH ENCODING AND DECODING

[75] Inventors: James O. Normile, Woodside; Katherine Shu-wei Wang, San Jose; Ke-Chiang Chu, Saratoga; Dulce B. Ponceleon, Palo Alto; Hsi-Jung Wu, Sunnyvale, all of Calif.

[73] Assignee: Apple Computer, Inc., Cupertino, Calif.

[21] Appl. No.: 291,655

[22] Filed: Aug. 17, 1994

[51] Int. Cl.$^6$ .................................................. H03M 7/40
[52] U.S. Cl. .............................. 341/67; 341/55; 341/106
[58] Field of Search .............................. 341/55, 67, 95, 341/106

[56] References Cited

U.S. PATENT DOCUMENTS

| | | |
|---|---|---|
| 3,717,851 | 2/1973 | Cocke et al. . |
| 4,876,541 | 10/1989 | Storer ........................................ 341/51 |
| 5,150,430 | 9/1992 | Chu ........................................... 341/51 |
| 5,173,695 | 12/1992 | Sun et al. ................................. 341/67 |
| 5,253,053 | 10/1993 | Chu et al. ................................ 382/133 |
| 5,414,425 | 5/1995 | Whiting et al. ......................... 341/95 |

*Primary Examiner*—Todd E. DeBoer
*Attorney, Agent, or Firm*—Fenwick & West, LLP

[57] ABSTRACT

Decoding and encoding of variable length data words and data strings is accelerated by testing for and processing more than one word or string per encoding or decoding cycle. In an encoding scheme wherein fixed length data words are encoded into variable length data strings, decoding is carried out by first receiving a data stream having a plurality of encoded data strings contained therein, and then testing at least a portion of the data stream to determine whether the portion contains one of a number of selected sets of multiple data strings. If the portion of the data stream contains one of the selected sets of multiple data strings, the multiple data strings are decoded into a corresponding set of multiple data words. This decoding procedure allows a plurality of encoded data strings to be decoded in a single decoding cycle. The procedure may be implemented using either a single lookup table or a set of split-level lookup tables. The above procedure may also be applied to an encoding scheme wherein variable length data words are transformed into fixed length encoded data strings to encode the variable length data words. Furthermore, the above procedure may be applied to an encoding scheme wherein variable length data words are transformed into variable length data strings to both encode and decode the variable length data words and data strings.

36 Claims, 14 Drawing Sheets

| Data Word | Encoded Data String |
|---|---|
| a | 0 |
| b | 10 |
| c | 110 |
| d | 1110 |
| e | 11110 |

| Index | Data Word | Length |
|---|---|---|
| 0xxxx | a | 1 |
| 10xxx | b | 2 |
| 110xx | c | 3 |
| 1110x | d | 4 |
| 11110 | e | 5 |

| Index | Data Words | | | | | Word Count | Length |
|---|---|---|---|---|---|---|---|
| | 1 | 2 | 3 | 4 | 5 | | |
| 00000 | a | a | a | a | a | 5 | 5 |
| 00001 | a | a | a | a | x | 4 | 4 |
| 00010 | a | a | a | b | x | 4 | 5 |
| 00011 | a | a | a | x | x | 3 | 3 |
| 00100 | a | a | b | a | x | 4 | 5 |
| 00101 | a | a | b | x | x | 3 | 4 |
| 00110 | a | a | c | x | x | 3 | 5 |
| 00111 | a | a | x | x | x | 2 | 2 |
| 01000 | a | b | a | a | x | 4 | 5 |
| 01001 | a | b | a | x | x | 3 | 4 |
| 01010 | a | b | b | x | x | 3 | 5 |
| 01011 | a | b | x | x | x | 2 | 3 |
| 01100 | a | c | a | x | x | 3 | 5 |
| 01101 | a | c | x | x | x | 2 | 4 |
| 01110 | a | d | x | x | x | 2 | 5 |
| 01111 | a | x | x | x | x | 1 | 1 |
| 10000 | b | a | a | a | x | 4 | 5 |
| 10001 | b | a | a | x | x | 3 | 4 |
| 10010 | b | a | b | x | x | 3 | 5 |
| 10011 | b | a | x | x | x | 2 | 3 |
| 10100 | b | b | a | x | x | 3 | 5 |
| 10101 | b | b | x | x | x | 2 | 4 |
| 10110 | b | c | x | x | x | 2 | 5 |
| 10111 | b | x | x | x | x | 1 | 2 |
| 11000 | c | a | a | x | x | 3 | 5 |
| 11001 | c | a | x | x | x | 2 | 4 |
| 11010 | c | b | x | x | x | 2 | 5 |
| 11011 | c | x | x | x | x | 1 | 3 |
| 11100 | d | a | x | x | x | 2 | 5 |
| 11101 | d | x | x | x | x | 1 | 4 |
| 11110 | e | x | x | x | x | 1 | 5 |
| 11111 | x | x | x | x | x | 0 | 0 |

FIG. 5

| Data Word | Encoded Data String |
|-----------|---------------------|
| a | 0 |
| b | 10 |
| c | 110 |
| d | 1110 |
| e | 11110 |
| f | 111110 |
| g | 1111110 |
| h | 1111111 |

| Index | Data Words 1 | 2 | 3 | 4 | Word Count | Length |
|---|---|---|---|---|---|---|
| 0000 | a | a | a | a | 4 | 4 |
| 0001 | a | a | a | x | 3 | 3 |
| 0010 | a | a | b | x | 3 | 4 |
| 0011 | a | a | x | x | 2 | 2 |
| 0100 | a | b | a | x | 3 | 4 |
| 0101 | a | b | x | x | 2 | 3 |
| 0110 | a | c | x | x | 2 | 4 |
| 0111 | a | x | x | x | 1 | 1 |
| 1000 | b | a | a | x | 3 | 4 |
| 1001 | b | a | x | x | 2 | 3 |
| 1010 | b | b | x | x | 2 | 4 |
| 1011 | b | x | x | x | 1 | 2 |
| 1100 | c | a | x | x | 2 | 4 |
| 1101 | c | x | x | x | 1 | 3 |
| 1110 | d | x | x | x | 1 | 4 |
| Overflow 1111 | | | | Pointer to next table | | |

57

| Index | Data Words 1 | 2 | 3 | Word Count | Length |
|---|---|---|---|---|---|
| 000 | e | a | a | 3 | 7 |
| 001 | e | a | x | 2 | 6 |
| 010 | e | b | x | 2 | 7 |
| 011 | e | x | x | 1 | 5 |
| 100 | f | a | x | 2 | 7 |
| 101 | f | x | x | 1 | 6 |
| 110 | g | x | x | 1 | 7 |
| 111 | h | x | x | 1 | 7 |

| Data Words | Encoded Data String |
|---|---|
| a | 00 |
| b a | 01 |
| c b a | 10 |
| d c b a | 11 |

|       | Data Strings |    |    |    | String |        |
| Index | 1  | 2  | 3  | 4  | Count  | Length |
|-------|----|----|----|----|--------|--------|
| aaaa  | 00 | 00 | 00 | 00 | 4 | 4 |
| aaab  | 00 | 00 | 00 | x  | 3 | 3 |
| aaac  | 00 | 00 | 00 | x  | 3 | 3 |
| aaad  | 00 | 00 | 00 | x  | 3 | 3 |
| aaba  | 00 | 00 | 01 | x  | 3 | 4 |
| abaa  | 00 | 01 | 00 | x  | 3 | 4 |
| abab  | 00 | 01 | x  | x  | 2 | 3 |
| abac  | 00 | 01 | x  | x  | 2 | 3 |
| abad  | 00 | 01 | x  | x  | 2 | 3 |
| acba  | 00 | 10 | x  | x  | 2 | 4 |
| baaa  | 01 | 00 | 00 | x  | 3 | 4 |
| baab  | 01 | 00 | x  | x  | 2 | 3 |
| baac  | 01 | 00 | x  | x  | 2 | 3 |
| baad  | 01 | 00 | x  | x  | 2 | 3 |
| baba  | 01 | 01 | x  | x  | 2 | 4 |
| bacb  | 01 | x  | x  | x  | 1 | 2 |
| badc  | 01 | x  | x  | x  | 1 | 2 |
| cbaa  | 10 | 00 | x  | x  | 2 | 4 |
| cbab  | 10 | x  | x  | x  | 1 | 3 |
| cbac  | 10 | x  | x  | x  | 1 | 3 |
| cbad  | 10 | x  | x  | x  | 1 | 3 |
| dcba  | 11 | x  | x  | x  | 1 | 4 |

| Index | Data Strings | | | | String Count | Length |
|---|---|---|---|---|---|---|
| | 1 | 2 | 3 | 4 | | |
| aaaa | P1 | P1 | P1 | P1 | 4 | 4 |
| aaab | P1 | P1 | P1 | x | 3 | 3 |
| aaac | P1 | P1 | P1 | x | 3 | 3 |
| aaad | P1 | P1 | P1 | x | 3 | 3 |
| aaba | P1 | P1 | P2 | x | 3 | 4 |
| abaa | P1 | P2 | P1 | x | 3 | 4 |
| abab | P1 | P2 | x | x | 2 | 3 |
| abac | P1 | P2 | x | x | 2 | 3 |
| abad | P1 | P2 | x | x | 2 | 3 |
| acba | P1 | P3 | x | x | 2 | 4 |
| baaa | P2 | P1 | P1 | x | 3 | 4 |
| baab | P2 | P1 | x | x | 2 | 3 |
| baac | P2 | P1 | x | x | 2 | 3 |
| baad | P2 | P1 | x | x | 2 | 3 |
| baba | P2 | P2 | x | x | 2 | 4 |
| bacb | P2 | x | x | x | 1 | 2 |
| badc | P2 | x | x | x | 1 | 2 |
| cbaa | P3 | P1 | x | x | 2 | 4 |
| cbab | P3 | x | x | x | 1 | 3 |
| cbac | P3 | x | x | x | 1 | 3 |
| cbad | P3 | x | x | x | 1 | 3 |
| dcba | P4 | x | x | x | 1 | 4 |

FIG. 16

| Data Words | Encoded Data String |
|---|---|
| a | 0 |
| b a | 10 |
| c b a | 110 |
| d c b a | 1110 |

FIG. 15

| Pointer | Data String / Data Word | Length |
|---|---|---|
| P1 | 0 | 1 |
| P2 | 10 | 2 |
| P3 | 110 | 3 |
| P4 | 1110 | 4 |
| P5 | a | 1 |
| P6 | ba | 2 |
| P7 | cba | 3 |
| P8 | dcba | 4 |

| Index | Data Words | | | | Word Count | Length |
|---|---|---|---|---|---|---|
| | 1 | 2 | 3 | 4 | | |
| 0000 | P5 | P5 | P5 | P5 | 4 | 4 |
| 0001 | P5 | P5 | P5 | x | 3 | 3 |
| 0010 | P5 | P5 | P6 | x | 3 | 4 |
| 0011 | P5 | P5 | x | x | 2 | 2 |
| 0100 | P5 | P6 | P5 | x | 3 | 4 |
| 0101 | P5 | P6 | x | x | 2 | 3 |
| 0110 | P5 | P7 | x | x | 2 | 4 |
| 0111 | P5 | x | x | x | 1 | 1 |
| 1000 | P6 | P5 | P5 | x | 3 | 4 |
| 1001 | P6 | P5 | x | x | 2 | 3 |
| 1010 | P6 | P6 | x | x | 2 | 4 |
| 1011 | P6 | x | x | x | 1 | 2 |
| 1100 | P7 | P5 | x | x | 2 | 4 |
| 1101 | P7 | x | x | x | 1 | 3 |
| 1110 | P8 | x | x | x | 1 | 4 |
| 1111 | x | x | x | x | 0 | 0 |

FIG. 18

MULTI-WORD VARIABLE LENGTH ENCODING AND DECODING

FIELD OF THE INVENTION

This invention relates generally to data compression and more particularly to a mechanism for encoding and decoding variable length data words and data strings which allows more than one word or string to be encoded or decoded per cycle.

BACKGROUND OF THE INVENTION

With the increasing demand for video telephony, video conferencing, and multimedia, full motion video on computer generated displays has become an important topic in recent times. A major aspect of full motion video which sets it apart from other types of computer generated displays is that it requires an exceptionally high rate of information transfer between the data source and the display mechanism. This high transfer rate is needed in order to refresh the display at a sufficient rate so as to provide a moving image which is reasonably clear and free of "fuzzy" edges. Currently, however, due to transmission line and hardware constraints, it is not possible to transfer data in a regular format at a sufficient rate to provide a clear moving image. As a result, data compression techniques are typically implemented to transfer more information in shorter periods of time. In addition to full motion video displays, data compression may also be implemented in other applications such as in audio transmissions, communications, compressed data storage, network applications, and various other applications which have bandwidth limitations. Thus, data compression has wide applicability.

One compression method which is currently employed involves the use of variable length encoding and decoding. The basic concept underlying variable length coding, or statistical coding as it is sometimes known, is that data which occurs most frequently should be assigned a code having the fewest number of bits, and data which occurs least frequently should be assigned a code having the largest number of bits. Statistical coding makes it highly probable that most information will be encoded using short codes with only a small portion being represented by long codes. On average, significantly more information can be contained in a specified number of bits using variable length codes rather than fixed length codes.

Data compression using variable length codes may be implemented in a number of different encoding/decoding schemes, including schemes which encode fixed length data words into variable length data strings (fixed-to-variable), schemes which encode variable length data words into fixed length data strings (variable-to-fixed), and schemes which encode variable length data words into variable length data strings (variable-to-variable). Within these schemes, encoding and decoding may be carried out in various ways. One way in which decoding is carried out in a fixed-to-variable scheme involves the use of a finite state machine or a decoding tree. According to this method, an incoming data stream is decoded one bit at a time until a complete encoded data string is decoded. Thereafter, the process is repeated to decode the next data string in the data stream. This method decodes the incoming data properly; however, it is unacceptably slow in that it decodes only one bit per decoding cycle. A faster implementation involves the use of a look-up table. In this implementation, decoding information is stored in a memory, and this information is accessed by applying the incoming bit stream or a portion thereof as an address to the memory. The use of a look-up table allows one data string to be decoded per decoding cycle. While the look-up tables which are currently used provide significant performance improvement over the decoding tree, they are limited in that at most one data string is decoded per decoding cycle, regardless of how the data strings are arranged in the incoming data stream. A more desirable method would be one which recognizes certain combinations of data strings in the data stream, and takes advantage of these combinations to decode more than one data string per cycle. Currently, however, there is no mechanism believed to be available which has this capability.

SUMMARY OF THE INVENTION

The present invention is based, at least partially, on the realization that multiple encoded data strings in an incoming data stream may be detected in much the same manner as a single data string, and that such detection of multiple data strings can be achieved without adversely affecting system performance. In accordance with this realization, the present invention tests the incoming data stream (or a portion thereof) for selected sets or combinations of multiple data strings, and if one of these sets is detected, the set of multiple data strings is decoded into a corresponding set of decoded data words. By so doing, a plurality of data strings are decoded into a plurality of data words in a single decoding cycle.

The present invention is preferably implemented by way of one or more lookup tables. In a first embodiment, a single lookup table is used. The table preferably contains a plurality of entries, with each entry having an index associated therewith, and each entry storing at least one and preferably a plurality of decoded data words. Preferably, the table is structured such that the data words stored in each entry correspond to data strings contained in the index for that entry. That is, the index represents the set of encoded data strings to be decoded, and the data words in the entry represent the set of decoded data words corresponding to that set of encoded data strings. Thus, when a data stream containing data strings is used as an index to access an entry, and the data words in that entry are retrieved, the data strings in that data stream are in effect being decoded into the plurality of data words in the entry. Since a plurality of decoded data words are retrieved in a single table access, a plurality of encoded data strings are decoded in a single decoding cycle. Thus, the present invention provides a significant performance advantage over the "one data string per decoding cycle" capability of the prior art.

In a second embodiment of the invention, multiple split-level lookup tables are used in place of the single lookup table. This embodiment minimizes the amount of memory required to implement the variable length decoding function. In the second embodiment, a first and a second lookup tables are preferably provided. The first lookup table preferably comprises a plurality of entries, with each entry having an index associated therewith, and each entry (except for an overflow entry) storing at least one and preferably a plurality of decoded data words therein. Preferably, the indices of this first table are shorter than the indices in the single table of the first embodiment; thus, the indices of the first table contain fewer encoded data strings. The first lookup table preferably further comprises an overflow entry, having an overflow index, which contains a pointer to a second lookup table. The second table is consulted only when the overflow entry is accessed. Like the first table, the second lookup table comprises a plurality of entries, with each entry having an index associated therewith, and each entry storing at least one and preferably a plurality of decoded data words therein. Unlike the first table, however, the decoded data word or words stored in an entry of the second table correspond not to the index associated with that entry, but to the combination of the overflow index and the index associated with that entry. Thus, the second lookup table tests for longer encoded data strings than does the first table. Both embodiments of the present invention function effectively to decode variable length codes.

In addition to decoding variable length data strings in a fixed-to-variable scheme, the present invention may also be utilized to encode variable length data words in a variable-to-fixed scheme. Furthermore, the present invention may be used to both encode and decode variable length data words and data strings in a variable-to-variable scheme. These applications may be achieved with only slight modification of the invention, and are within the scope of the present invention.

BRIEF DESCRIPTION OF THE DRAWINGS

FIG. 5 depicts a decoding lookup table generated in accordance with a first embodiment of the present invention for the codebook shown in FIG. 1.

FIG. 9 depicts split-level decoding lookup tables generated in accordance with a second embodiment of the present invention for the codebook shown in FIG. 8.

FIG. 14 depicts an encoding lookup table generated in accordance with the present invention for ecoding variable length data word streams.

FIG. 15 depicts a sample codebook for use in illustrating the processes of encoding and decoding variable length data words and data strings in a variable-to-variable encoding scheme.

FIG. 16 depicts an encoding lookup table generated in accordance with the present invention for encoding variable length data words into variable length data strings.

FIG. 17 depicts a pointer translation table for use in translating pointers contained in the tables of FIGS. 16 and 18 into data words or data strings.

FIG. 18 depicts a decoding lookup table generated in accordance with the present invention for decoding variable length data strings into variable length data words.

DETAILED DESCRIPTION OF THE PREFERRED EMBODIMENTS

In order to fully understand and to appreciate the advantages provided by the present invention, it is necessary to first understand the shortcomings of the prior art. Thus, a brief description of the prior art method for decoding variable length codes is provided below.

The prior art method is best understood by way of example. Suppose for the sake of illustration that an encoding/decoding scheme utilizes the codebook shown in FIG. 1. The left column of the codebook contains the original fixed length data words (represented for convenience by the letters "a" through "e"), and the right column represents the data strings into which the data words are encoded. Notice that the encoded data strings vary in length from one bit to five bits. It is this length variance which makes the data stream difficult to decode.

Figures 1, 2, 3:
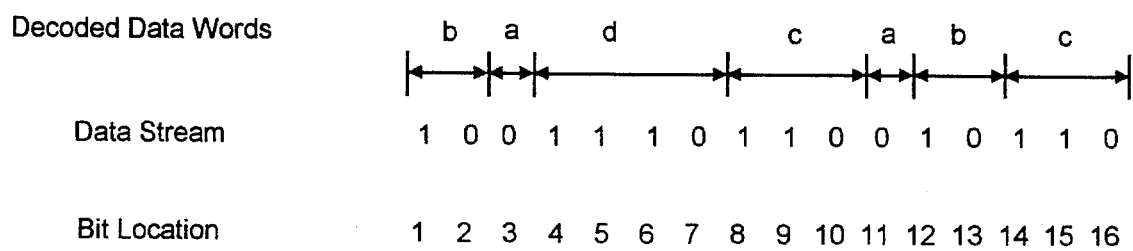
FIG. 1 depicts a sample codebook for use in illustrating the present invention.
FIG. 2 depicts a sample data stream for use in describing the manner in which the present invention decodes data strings in a data stream.
FIG. 3 depicts a sample decoding lookup table generated in accordance with a prior art method for the codebook shown in FIG. 1.

Encoding data words using the codebook of FIG. 1 is a simple matter. Because each of the data words is a fixed length word, a simple table lookup process can be used to transform each data word into its corresponding encoded data string. Thus, the data word stream "badcabc" can be easily transformed into the data stream 1001110110010110 shown in FIG. 2. The decoding process, however, is significantly more complex. Because of the variable length nature of the encoded data strings, it is uncertain how many complete data strings, if any, are contained in a particular number of bits. Because of this uncertainty, a more complex lookup table is needed to decode the data strings.

A decoding lookup table which is constructed in accordance with the prior art method, and which corresponds to the codebook of FIG. 1, is shown in FIG. 3. The table of FIG. 3 comprises a plurality of entries, each entry having an index associated therewith, and each entry storing a data word and a length. The indices of the table are used much like addresses to access particular entries in the table. The indices, however, serve as more than just addresses. They also represent encoded data strings which are decoded by the corresponding entry. More particularly, each index in the table of FIG. 3 represents an encoded data string to be decoded, and each data word stored in each entry represents the decoded data word corresponding to the data string contained in the index. This is made clear in FIG. 3. For example, the index 1110x contains the encoded data string 1110, which corresponds to the data word "d". Consequently, in the entry corresponding to index 1110x, the data word "d" is stored, along with the length "4" (in number of bits) of the data string. Thus, the table of FIG. 3 acts as a true decoding table. At this point, it should be noted that the x's in the index column represent "don't care" conditions. These indicate that selected bits of certain indices may be either a "1" or a "0". Because of the various possible combinations of the "don't care" bits, the table of FIG. 3 actually has $2^5$ or 32 different indices with 32 corresponding entries, not just the five that are shown. FIG. 3 shows only five entries in order to emphasize the decoding nature of the table.

To illustrate how the table of FIG. 3 may be used to decode a stream of encoded data strings, suppose that the data stream shown in FIG. 2 is received and needs to be decoded. The decoding process begins with selecting a portion of the incoming data stream to decode. Since the longest data string in the code book of FIG. 1 is five bits, decoding will commence by testing the first five bits of the data stream. Applying bits 1–5 (10011) of the data stream as an index to the table of FIG. 3, the data word "b" and the length "2" are retrieved. This information indicates that: (1) an encoded data string "10" has been detected and recognized; (2) the data string has a length of two bits; (3) the decoded data word corresponding to the data string is "b"; and (4) bits 3–5 have not been decoded. After bits 1–2 are thus decoded, the process continues to the next five bits in the data stream. Since bits 3–5 were not decoded in the first decoding cycle, the five bits which are tested in the following decoding cycle are bits 3–7. Applying these bits (01110) to the table of FIG. 3, data word "a" and length "1" are retrieved. From this information, it is known that another data string "0" has been detected, that this data string has a length of one bit, that this data string been decoded as an "a", and that testing should continue with bits 4–8 of the data stream. This process is repeated for seven decoding cycles until the entire data stream is decoded into the data word stream "badcabc".

A significant point which should be noted from the above discussion is that the method of the prior art decodes at most one encoded data string per decoding cycle. This is true regardless of how the data strings are arranged. For example, if the data stream 00000 is received, the prior an method would require five decoding cycles to decipher the data stream, even though it is clear from inspection that the stream represents five "a" data words. What is lacking in the prior art is the ability to recognize possible combinations of data strings, and to take advantage of these combinations to decode more than one data string per cycle. The mechanism of the present invention has this capability.

Figure 4:
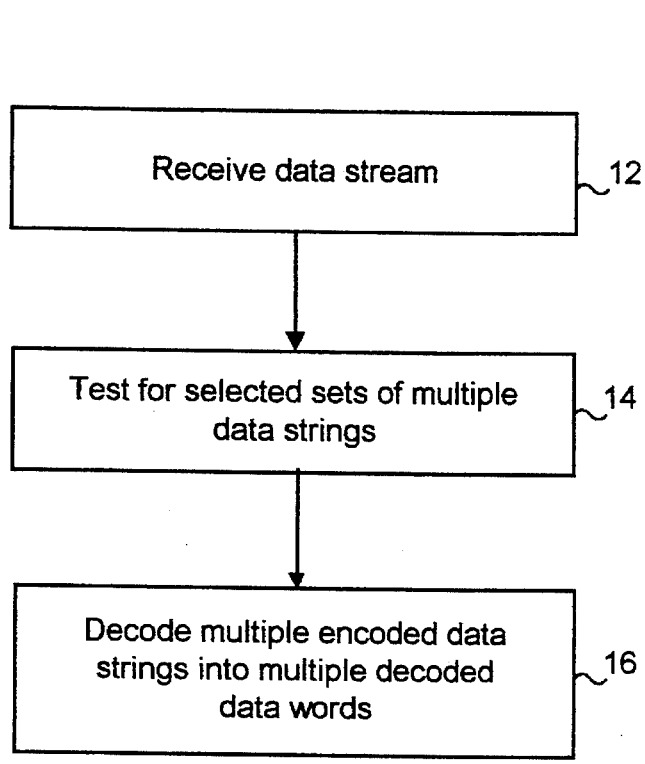
FIG. 4 is a generalized flow diagram for the method of the present invention.

With reference to the flow diagram provided in FIG. 4, the method 10 of the present invention preferably comprises three major steps. In step 12, a data stream, preferably comprising a plurality of variable length encoded data strings, is received. Then, in step 14, the data stream, or a portion thereof, is tested to determine whether the tested portion contains one of a number of selected sets of multiple encoded data strings. In other words, a portion of the data stream is checked for certain combinations of encoded data strings. If only one encoded data string is found, then that single string is decoded. However, if the portion contains one of the selected sets of multiple encoded data strings, then the multiple data strings are decoded 16 into a corresponding set of multiple decoded data words, preferably in a single decoding cycle. Thus, in one decoding cycle, a plurality of data strings are decoded. This represents a significant improvement over the method of the prior art.

The method 10 of the present invention is preferably implemented by way of one or more decoding lookup tables. In a first embodiment, a single lookup table is used. In a second embodiment, multiple split-level lookup tables are used to minimize memory requirements. With reference to FIGS. 1 and 5, the first embodiment will now be described in connection with the sample codebook shown in FIG. 1. According to the method of the present invention, encoding is performed in substantially the same manner as in the prior art. Specifically, fixed length data words are transformed into variable length encoded data strings through a straightforward lookup process. Decoding, however, is carried out in a different manner.

With reference to FIG. 5, there is shown a decoding table 18 created in accordance with the principles of the present invention for the codebook of FIG. 1. The table 18 preferably comprises a plurality of entries, with each entry storing at least one, and preferably a plurality of decoded data words, a data word count indicating the number of data words stored in the entry, and a length indicating the number of bits of data strings that are decoded by the entry. Associated with each entry is a unique index which is used to access that particular entry. The index, in addition to being a mechanism for accessing an entry, also represents the data strings that are decoded by that entry. This point will become clear as the construction of table 18 is described.

In accordance with the present invention, table 18 is preferably generated by first choosing a length, in terms of number of bits, for each of the indices in the table. The indices may be of any arbitrary length but, preferably, they have the same or greater length as the longest data string in the codebook to ensure that all data strings can be decoded. In the sample codebook of FIG. 1, the longest data string is five bits long. Thus, in this example, each index is five bits long as shown in table 18. Once the index length is chosen, all of the possible combinations of the five bits are listed. In the present example, $2^5$ or 32 different bit combinations are listed, with each bit combination representing a unique index to the table 18 as shown in FIG. 5.

After the indices are thus generated, each index is inspected for the presence of data strings. If data strings are detected and recognized in the index, the data strings are decoded into their corresponding data words, and these data words are stored in the data words field of the entry corresponding to the index. Thus, for example, inspecting index 00000 reveals that five encoded data strings of "0" are contained therein. Using the codebook of FIG. 1, these data strings are decoded into five "a" data words, and these five "a" data words are stored in the data words field of the entry corresponding to index 00000. Likewise, inspecting index 10100 reveals that data strings "10", "10", and "0", are contained therein. Again, using the codebook of FIG. 1, these data strings are decoded into the data words "b", "b", and "a", and these data words are stored in the data words field of the entry corresponding to index 10100. This process is preferably carried out for all of the indices in table 18 to generate a true decoding table. From this description, it should be clear that each index in table 18 serves a dual purpose. First, it functions as a means for accessing a particular entry in the table 18. Second, it represents the data string/strings that are decoded by the corresponding entry in the table 18. Because of the dual purpose nature of each index, when a data stream is applied to the table, and information is retrieved from one of the entries, the data strings in the data stream are in effect being decoded into the data words retrieved from the entry. Note that most of the entries in table 18 store more than one decoded data word. This means that for most accesses to the table 18, more than one data string is decoded. Hence, table 18 makes it possible to decode multiple data strings in a single cycle.

In order to make table 18 complete, several additional pieces of information are preferably included. One additional piece of information is the word count parameter. Due to the variable length nature of the data strings, some indices will contain more data strings than others. For example, index 00000 contains five data strings while index 10100 contains only three. Since the number of data strings in an index, and hence, the number of decoded data words stored in an entry, can vary from index to index and entry to entry, each entry preferably contains a word count parameter which specifies how many data words are contained in the entry. Thus, for example, the entry corresponding to index 00000 contains a word count of "5" since five data strings are contained in the index and five decoded data words are stored in the corresponding entry. Another additional bit of information which is preferably included in table 18 is the length parameter. Note that for many of the indices, not all of the index bits are decoded. For example, for the index 10101, only the first four bits are recognized as data words "b" and "b". The least significant bit, which is probably pan of a subsequent data string, is not decoded. Likewise, for index 01111, only the first bit is recognized and decoded as data word "a". The last four bits are not decoded. Because the number of bits decoded varies from index to index, each entry preferably specifies in the length field the number of bits decoded. Thus, for example, index 10101 has a "4" in the length field because the first four bits are decoded by the entry. Index 01111 has a "1" in the length field because only the first bit is decoded by the entry. One additional point to note with regard to table 18 is the presence of the "x" in the data words field of some entries. Because the number of data words can vary from entry to entry, dummy data (represented by x) is used to fill in spaces which are not used to store actual data words. Preferably, any system utilizing table 18 recognizes x as dummy data and treats it as such.

At this point, it should be noted that the table of FIG. 5 has been generated specifically for the codebook of FIG. 1 to illustrate the invention. A decoding table need not have the same specifications as that shown in FIG. 5. For example, each index may contain any desired number of bits and each entry may store any desired number of decoded data words. The principles taught herein may be applied generally to generate any desired decoding table. Such applications are within the scope of the present invention.

To illustrate how the table of FIG. 5 may be used to decode an incoming data stream containing a plurality of variable length encoded data strings, suppose again that the data stream shown in FIG. 2 is received and needs to be decoded. Suppose further that the data stream is tested five bits at a time. Under these assumptions, decoding begins by applying bits 1–5 (10011) of the data stream as an index to the table 18. This index causes two data words (b and a) to be retrieved from the table 18, along with a word count (2), and a length (3). This information indicates that two data strings have been decoded into the data words "b" and "a", and that the length, in bits, of the two decoded data strings is three. Based on this information, it is known that the first three bits of the data stream have been decoded. Thus, in the following decoding cycle, bits 4–8 of the data stream are tested. Applying these bits (11101) to the table 18 causes data word "d", count "1", and length "4" to be retrieved. From this information, it is ascertained that bits 4–7 have been decoded into the single data word "d". Then, in the next decoding cycle, bits 8–12 are applied to the table to retrieve the data words "c" and "a", the word count "2", and the length "4". This information indicates that bits 8–11 have been decoded into the two data words "c" and "a". Finally, in the last cycle, the remaining five bits (10110) are applied to the table and are decoded into the data words "b" and "c". In this manner, the entire data stream is decoded.

Several points should be noted from the above discussion. First, note that during the first, third, and fourth decoding cycles, two data strings are decoded during each of these cycles. As a result, the method of the present invention is able to decode the data stream in four cycles, rather than the seven cycles required by the prior art, which represents a significant improvement in efficiency. This efficiency improvement could be even greater if more short codes are decoded. For example, for the data stream 00000, the present invention provides a 500% improvement in efficiency over the prior art. Second, note that the improvement in efficiency is achieved without sacrificing performance. The entries in the table of FIG. 5 are accessed in the same manner as in the prior art. No extra test cycle or extra processing is required. Third, the increase in efficiency is achieved without significantly increasing hardware requirements. While the table of FIG. 5 requires more memory due to the extra data words and word count parameter stored in each entry, the increase in memory requirement is not significant. Hence, the present invention provides significant performance improvement at very little cost.

Figure 6:
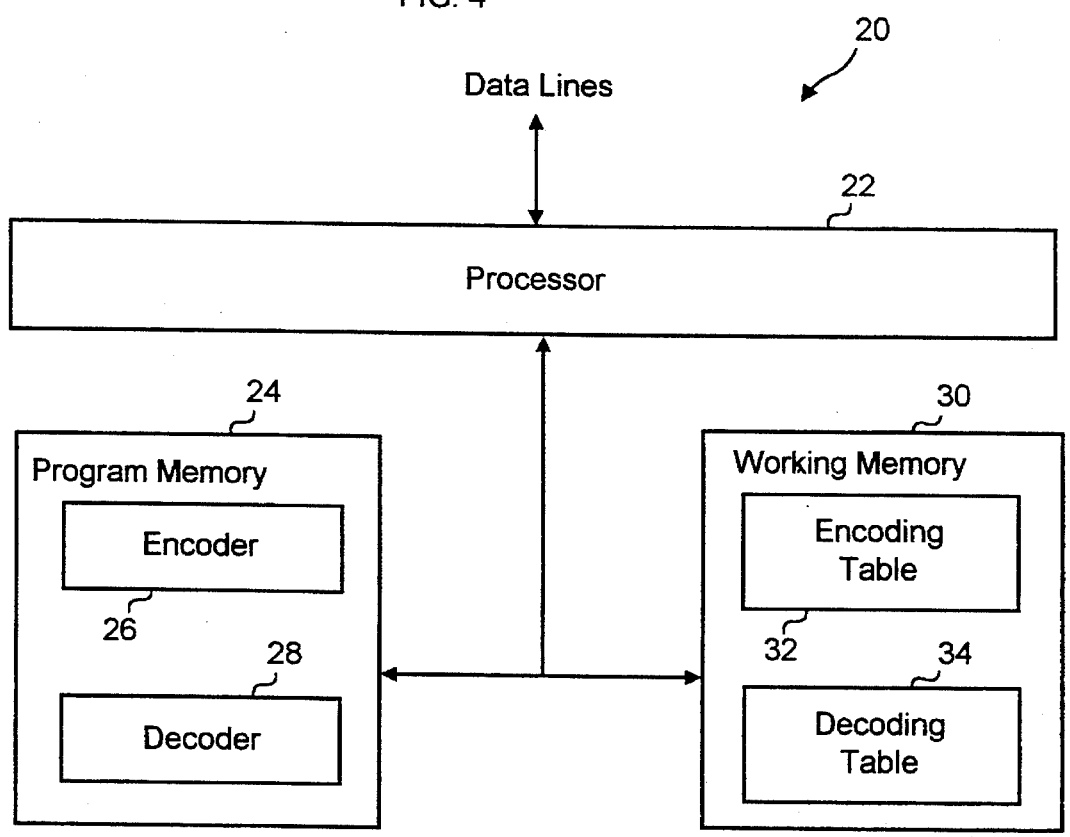
FIG. 6 is a block diagram representation of a system 20 which may be employed to implement the first embodiment of the present invention.

With reference to FIG. 6, there is shown a system 20 which may be employed to implement the first embodiment of the present invention. The system 20 preferably comprises a general purpose processor 22 coupled to a set of data lines to receive data therefrom, a program memory 24 for storing an encoder program 26 and a decoder program 28, and a working memory 30 for storing an encoding table 32 and a decoding table 34. Encoding table 32 preferably takes the form of a codebook, such as that shown in FIG. 1, and decoding table 34 preferably takes the form of a decoding lookup table constructed in accordance with the first embodiment of the present invention, such as that shown in FIG. 5. The Processor 22 preferably accesses and executes the programs 26 and 28 in program memory 24 to carry out the desired encoding and decoding functions of the system 20. With regard to encoding data words, system 20 performs this function in substantially the same manner as the prior art. Specifically, processor 22 receives fixed length data words on the data line, and in response, encodes these data words into variable length data strings using the encoding table 32 and a simple table lookup process.

Figure 7:
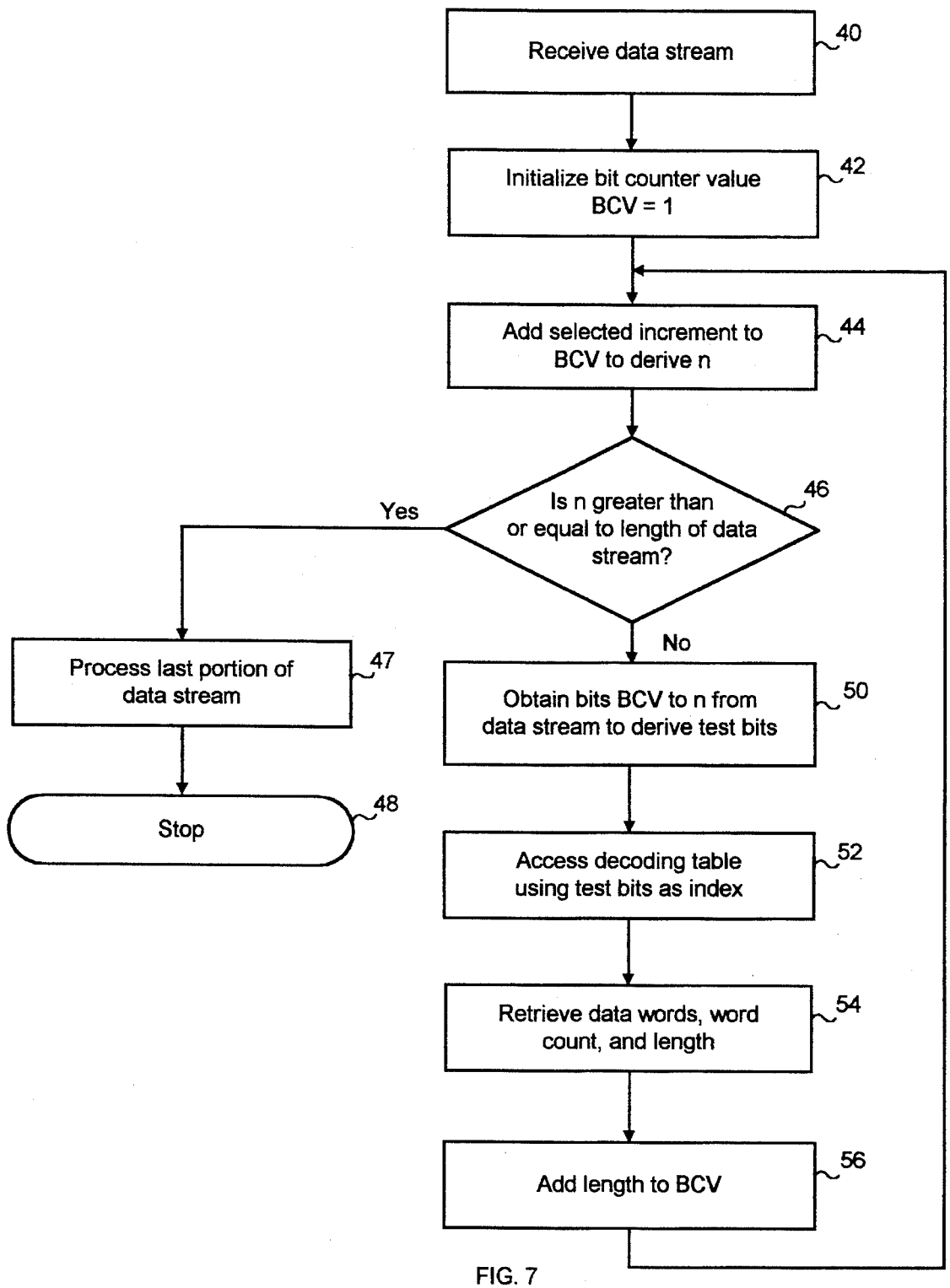
FIG. 7 is an operational flow diagram for the decoder program 28 of FIG. 6.

With regard to the decoding process, an operational flow diagram for the decoding program 28 is provided in FIG. 7. Before program 28 is executed, however, the decoding table 34 is preferably first provided via the data lines and stored in memory 30, or is generated by the processor 22 in accordance with the method disclosed above. Once table 34 is in place, processor 22 begins the decoding process by receiving 40 an incoming data stream from the data line, the data stream preferably comprising a plurality of encoded data strings. Then, processor 22 initializes 42 a bit value count (BCV) to 1. The BCV provides an indication of which bit in the data stream is the first bit to be tested in the upcoming decoding cycle. After BCV is initialized, a selected increment is added 44 to the BCV to derive a value n, which indicates which bit in the data stream is the last bit to be tested in the upcoming decoding cycle. If five bits of the data stream are tested per decoding cycle, then the selected increment of step 44 is four. After step 44, processor 22 determines 46 whether the value n is greater than or equal to the length of the data stream. If so, then it means that the last portion of the data stream will be tested in the upcoming decoding cycle. In such a case, processor 22 carries out step 47 to process the last of the data stream.

In step 47, processor 22 first determines whether n is equal to the length of the data stream. If so, then it means that the last portion of the data stream has the exact number of bits necessary for accessing table 34. In such an instance, processor 22 applies the last portion of the data stream to table 34 to retrieve a set of data words, a word count, and a count therefrom, and then stops 48 the decoding process since the data stream has now been fully decoded. If, on the other hand, n is not equal to, but is instead greater than, the length of the data stream, then it means that the last portion of the data stream is too short to be properly used as an index to access table 34. In this case, processor 22 preferably augments the last portion by adding extra bits to the portion to make it have the proper length. For example, if table 34 requires a five bit index but the last portion of the data stream only comprises three bits, then processor 22 preferably adds two extra bits to the last portion to enable the last portion to be applied as an index to the table 34. Preferably, all added bits take the form of a "0". The addition of "0's" to the data stream has the effect of adding extra "a" data words to the set of decoded data words. These extra "a's" will be taken into account, as explained below, after the augmented portion is decoded.

Preferably, decoding is achieved by applying the augmented portion as an index to the table 34 and retrieving the data words, word count, and length from a corresponding entry. Because the portion was augmented, however, not all of the retrieved data words should be used. Preferably, the number of retrieved data words which should be used is equal to the retrieved word count minus the number of "0's" that were added to the augmented portion. That is, if two "0's" were added, then two should be subtracted from the retrieved word count. For example, suppose that the last bits of the data stream are "100" and that two "0's" are added to produce the five bit stream "10000". Applying this as an index to the table of FIG. 5, the data words "b", "a", "a", and "a" are retrieved, along with a word count (4), and a length (5). Since two "0's" were added, two is subtracted from the word count (4) to derive the number (2) of data words which should be used. Thus, in this example, only the first two data words, "b" and "a" are used. This is correct since the actual data stream contained only the bits "100". The last portion of the data stream is thus properly decoded. After step 47, processor 22 stops 48 the decoding process since it knows that the entire data steam has now been decoded.

Referring again to step 46, if n is not greater than or equal to the length of the data stream, processor 22 proceeds to obtain 50 from the data stream the bits between and including BCV and n. Step 50 serves to select a portion of the data stream for testing in the upcoming decoding cycle. After the test bits are extracted from the data stream, they are applied as an index to table 34 to access 52 the table and to retrieve 54 the data words, word count, and length stored in the entry corresponding to the applied index. Since the data words stored in the entry correspond to the encoded data strings contained in the corresponding index, steps 52 and 54 serve to decode the data strings contained in the tests bits into corresponding data words. After the test bits, or a portion thereof, are decoded, processor 22 adds 56 the length retrieved from the accessed entry to the current BCV value to determine which bit in the data stream will be the first bit tested in the next decoding cycle. Once the new BCV value is computed, processor 22 loops back to step 44 to decode the next set of data strings. Process 44–56 repeats until the entire data stream is decoded.

The first embodiment of the present invention described thus far may be implemented advantageously in a variety of different applications to decode multiple data words per decoding cycle. One aspect of the first embodiment which may be of concern in certain applications is the size of the decoding table 34. For a codebook like that of FIG. 1 wherein the longest data string is five bits, the size of the decoding table is not a serious concern. However, for a codebook having data strings which are twenty bits long, thereby requiring a decoding table having $2^{20}$ entries, the size of the table 34 may become an important factor. For applications which are memory-sensitive, the second embodiment of the present invention is preferably implemented.

According to the second embodiment, decoding information is divided into multiple split-level lookup tables. A first table contains decoding information for the shorter data strings and the combinations thereof, and subsequent tables contain decoding information for the longer data strings and the combinations thereof. The subsequent tables are accessed only if a test data stream cannot be decoded by the first table. Such a configuration requires significantly less memory to implement than the first embodiment. The process of dividing a decoding table into split-level tables is fully described in U.S. Pat. No. 5,253,053, assigned to the same entity as the present invention, the text of which is incorporated herein by this reference. Since U.S. Pat. No. 5,253,053 fully describes the table division process, no further description of this process is needed herein. The following disclosure describes how split-level tables may be used to decode multiple data strings in a single decoding cycle in accordance with the principles of the present invention.

The second embodiment of the present invention is best illustrated with reference to an example. Suppose that an encoding/decoding scheme utilizes the codebook shown in FIG. 8. This codebook is a modified version of the codebook shown in FIG. 1, altered to further comprise three additional data words (f, g, and h) and corresponding variable length data strings. Suppose further that data streams generated using this codebook are decoded using a two-table decoding configuration. With these considerations in mind, the split-level decoding tables 57, 58 of FIG. 9 are generated. Since the longest data string in the codebook of FIG. 8 contains seven bits, the tables of FIG. 9 are preferably constructed such that the number of bits in the indices of both tables add up to at least seven. In the present example, seven bits are used.

The first table 57 preferably comprises a plurality of entries, with each entry (except the overflow entry) storing at least one and preferably a plurality of decoded data words, a word count, and a length therein, and each entry having a four bit index associated therewith. Table 57 is preferably generated using substantially the same method as that described for table 18 of FIG. 5. Specifically, a length is first chosen for the indices. Then, all of the possible indices are generated using different combinations of the index bits. Thereafter, each index is inspected for data strings, and when data strings are detected and recognized, they are translated into corresponding data words, and these data words are stored in the entry corresponding to the index. As with table 18, the indices of table 57 serve a dual purpose. An index provides not only a mechanism for accessing a particular entry in the table, but also represents the encoded data string or data strings corresponding to the decoded data words stored in a corresponding entry. Thus, for example, the index 00000, which contains four "0" data strings which decode into four in the same manner as that described previously for table 18.

Table 57 differs from table 18 in that an overflow entry is included in the table. In the overflow entry, no data words are stored; instead, a pointer which points to the location of the second table 58 is stored. Notice that the overflow index (1111) does not corresponding to any of the codes in the codebook of FIG. 8. When this index is applied, it means that the four index bits of the first table are insufficient to decode the tested portion of the incoming data stream. Consequently, it is necessary to consult the three additional index bits of the second table to decode the tested portion.

The second table 58 of FIG. 9 is quite similar to the first table 57 and may be generated in a similar manner. The second table 58 preferably comprises a plurality of entries, with each entry storing at least one and preferably a plurality of data words, a word count and a length therein, and each entry having a three-bit index associated therewith. A significant difference between the two tables 57 and 58 is that the indices of the second table 58 do not, by themselves, represent the data strings to be decoded. Rather, it is the combination of the overflow index and the three-bit indices which actually represent the data strings to be decoded. For example, the index 000 of the second table does not represent the data strings decoded by the corresponding entry. Rather, it is the combination (1111000) of the overflow index 1111 and the index 000 that is decoded by the data words "e", "a", and "a" of the corresponding entry. In generating table 58, this should be taken into account.

Figures 8, 10:
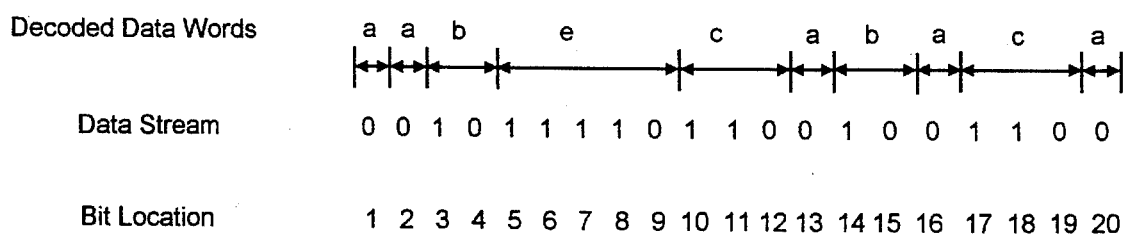
FIG. 8 depicts a sample codebook for use in illustrating the second embodiment of the present invention.
FIG. 10 depicts a sample data stream for use in describing the manner in which the second embodiment of the present invention decodes data strings in a data stream.

Accordingly, table 58 is generated by first choosing a length for each index. As mentioned above, in order to ensure that all data strings can be decoded by tables 57 and 58, the length of the combined indices of both tables is preferably at least equal to the length of the longest data string. Since the longest data string in the codebook of FIG. 8 is seven bits in length, the indices in table 58 are preferably at least three bits in length, as shown in FIG. 9, so that when combined with the overflow index, an index having at least seven bits is produced. Once the index length is chosen, all combinations of the three additional index bits are generated to produce the indices for the second table 58. Thereafter, each index in table 58 is combined with the overflow index to produce an augmented index, and it is this augmented index which is inspected and translated into data words. Thus, for example, index 000 is combined with the overflow index 1111 to produce an augmented index 1111000. Three data strings "11110", "0", and "0" are contained in this augmented index. According to the codebook of FIG. 8, these three data strings translate into the data words "e", "a", and "a". Therefore, these data words are stored in the data words field of the entry corresponding to index 000 in table 58. The word count (3) and the number of bits decoded (7) are also stored in the corresponding entry. This process is carried out for each index in table 58 until the table 58 shown in FIG. 9 is generated. Note that the second table 58 is used to decode longer data strings than the first table 57. Since the codebook is preferably constructed such that the most frequently encountered data strings are the short ones, most data strings will be decoded by the first table with only a few seldomly used long strings being decoded by the second table.

To illustrate how the tables of FIG. 9 may be used to decode a data stream, suppose that the data stream 00101111011001001100 shown in FIG. 10 needs to be decoded. In the following example, it will be assumed that the data stream is first tested four bits at a time to determine whether those four bits can be decoded by the first table. Only if the overflow entry is accessed, thereby meaning that the first table was unable to decode the four bits, will the next three bits in the data stream be tested using the second table. Based on these assumptions, decoding begins by testing bits 1–4 (0010). Applying these bits to the first table causes the data words "a", "a" and "b" to be retrieved, along with the word count (3) and the length (4). From this information, it is known that all four bits have been decoded into three data words. Thus, in the next decoding cycle, the next four bits (bits 5–8) are tested. Applying bits 5–8 (111 1) as an index to the first table, the overflow entry in the first table is accessed. This indicates that the first table was unable to decode the four bit portion and that, therefore, the second table needs to be consulted using the next three bits 9–11 (011) in the data stream. Accessing the second table using bits 9I 11 (011) as an index causes data word "e", word count (1), and length (5) to be retrieved. From this information, it is determined that five bits 5–9 (comprising the bits from the overflow index and the bits from the index of the second table) have been decoded into the data word "e". Thus, in the following decoding cycle, bits 10–13 of the data stream are tested. Applying bits 10–13 (1100) to the first table, the data words "b" and "a" are retrieved, along with the word count (2) and the length (4). From this, it is known that all four bits have been decoded and that the second table need not be consulted. Hence, in the following decoding cycle, bits 14–17 are tested. This decoding process is repeated for the entire data stream until the data word stream "aabecabaca" is derived. Note that the entire data stream is decoded in just six decoding cycles, as opposed to the ten cycles which would have been required by the prior art. Thus, the second embodiment of the present invention also provides a significant performance improvement over the prior art. At this point, it should be noted that the tables of FIG. 9 represent only one of the possible split-level table implementations of the second embodiment. Many other implementations are possible. For example, if so desired, the tables may be divided into three or more tables. Also, each table may be constructed to contain only a maximum number of data words, two for example, for each entry instead of the number of data words shown in FIG. 9. These and other modifications are within the scope of the present invention.

With reference to FIG. 10, there is shown a system 60 which may be employed to implement the second embodiment of the present invention. The system 60 preferably comprises a general purpose processor 62 coupled to a set of data lines for receiving data therefrom, a program memory 64 for storing an encoder program 66 and a decoder program 68, and a working memory 70 for storing an encoding table 72, such as that shown in FIG. 8, and multiple decoding tables 74 constructed in accordance with the present invention, such as those shown in FIG. 9. Processor 72 preferably accesses and executes programs 66 and 68 to carry out the desired encoding and decoding functions.

System 60 carries out the encoding function in much the same manner as the prior art. Particularly, using a codebook such as that shown in FIG. 8, and under the direction of program 66, processor 62 converts fixed length data words into variable length data strings using a straightforward lookup process. On the other hand, system 60 carries out the decoding function in a manner which differs significantly from the prior art. With reference to FIG. 12, there is shown an operational flow diagram for the decoding program 68 of FIG. 11, which is executed by processor 62 to perform the desired decoding functions.

Before program 68 is executed, tables 74 are preferably provided via the data lines and stored in memory 70, or are generated by processor 62 in accordance with the second embodiment described above. Once the tables 74 are in place, processor 62 begins operation by receiving 80 an incoming data stream comprising a plurality of encoded data strings. After the data stream is received, processor 62 initializes 82 a bit count value (BCV) to 1 to indicate that the first bit to be tested in the upcoming decoding cycle is the first bit in the data stream. Thereafter, processor 62 adds 84 a first table increment to the current value of BCV to derive a value m, and adds 86 a second table increment to the current value of BCV to derive a value n. The value m indicates which bit in the data stream is the last bit to be tested in the upcoming decoding cycle if only the first table is consulted, and the value n indicates which bit in the data stream is the last bit to be tested in the upcoming decoding cycle if the second table is consulted. Once m and n are computed, processor 62 determines 88 whether m is greater than or equal to the length of the data stream. If so, then it means that the last portion of the data stream will be decoded in the upcoming decoding cycle. In such a case, processor 62 processes 89 the last portion of the data stream and then stops 90 the decoding process. Preferably, step 89 is substantially identical to step 47 of FIG. 7; hence, it need not be repeated here.

If, however, m is not greater than the length of the data stream, processor 62 proceeds to obtain 92 the bits of the data stream between and including BCV and m. Thereafter, processor 62 determines 94 whether bits BCV to m match the overflow index of the first table. If not, processor 62 accesses 96 the first table using bits BCV to m as an index, and retrieves 98 the data words, word count, and length stored in the entry corresponding to the applied index. Bits BCV to m are thus decoded. Thereafter, processor 62 adds the length retrieved from the entry to the current value of BCV to derive a new BCV to indicate which bit should be the first bit tested in the next decoding cycle. Processor 62 then loops back to step 84 to decode another set of bits.

Referring again to step 94, if it is determined that bits BCV to m do match the overflow index, then processor 62 determines 102 whether n is greater than or equal to the length of the data stream. If not, then processor 62 accesses 104 the first table to retrieve the pointer to the second table. Thereafter, processor 62 obtains 106 bits m+1 to n from the data stream and uses these bits as an index to accesses 108 the second table. Step 104 in effect applies the additional bits necessary to access the second table. After an entry in the second table is accessed using the applied index, the data words, word count, and length stored in the entry are retrieved to decode the data strings contained in bits BCV to n. After step 106, processor 62 adds the length retrieved from the entry to the current value of BCV to derive a new BCV to indicate which bit should be the first bit tested in the next decoding cycle. Thereafter, processor 62 loops back to step 84 to decode another set of bits. Process 84–106 is repeated until the entire data stream is decoded.

Referring again to step 102, if it is determined that n is greater than or equal to the length of the data stream, then it means that the last portion of the data stream will be processed in the upcoming decoding cycle. In such an instance, processor 62 carries out step 112 to decode the last portion of the data stream, and then stops 114 the decoding process since the entire data stream has now been decoded. Preferably, step 112 is substantially identical to step 47 of FIG. 7. More specifically, processor 62 retrieves the last bits of the data stream, and adds bits to the data stream, as needed, to make the last portion have the proper length to be used as an index to access the second table. The second table is then accessed using the augmented portion, and data words are retrieved therefrom. Extraneous data words are thereafter removed to produce an accurate decoding of the last bits of the data stream. The last bits of the data stream are thus properly decoded.

Thus far, the invention has been described in connection with the decoding process in an encoding/decoding scheme wherein fixed length data words are encoded into variable length data strings. It should be noted, however, that the invention may also be applied to the encoding process in an encoding/decoding scheme wherein variable length data words are encoded into fixed length data strings. A process analogous to that described in FIG. 4 may be used. Specifically, encoding is preferably carried out by first receiving a data word stream having a plurality of variable length data words contained therein. Once received, the word stream, or a portion thereof, is tested for selected sets of multiple data words. That is, the word stream is checked for selected combinations of data words. If one of the selected sets of multiple data words is detected and recognized, then the data words are encoded into a corresponding set of multiple data strings. Thus, in one encoding cycle, a plurality of data words is encoding into a plurality of data strings.

Figures 11, 13:
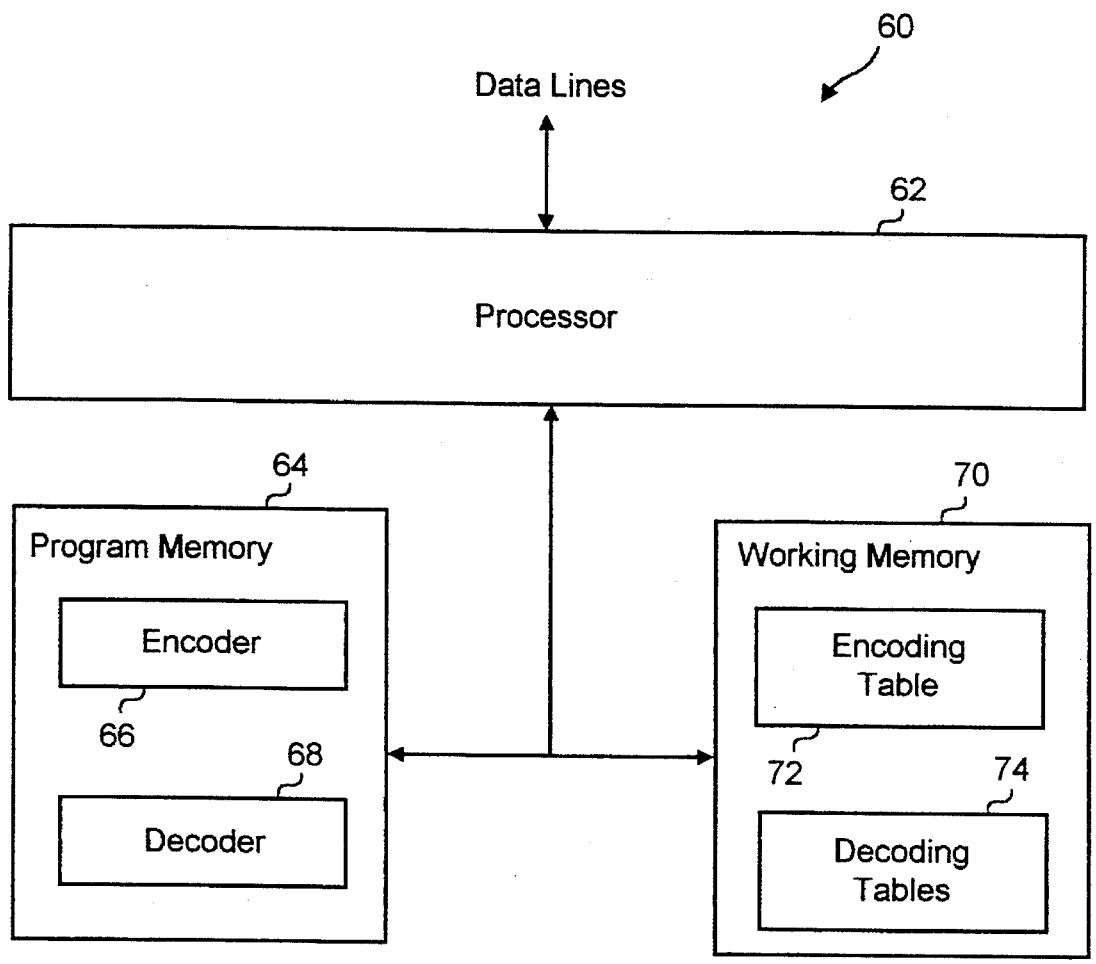
FIG. 11 is a block diagram representation of a system 60 which may be employed to implement the second embodiment of the present invention.
FIG. 13 depicts a sample codebook for use in illustrating the process of encoding a variable length data word stream.
Figure 12:
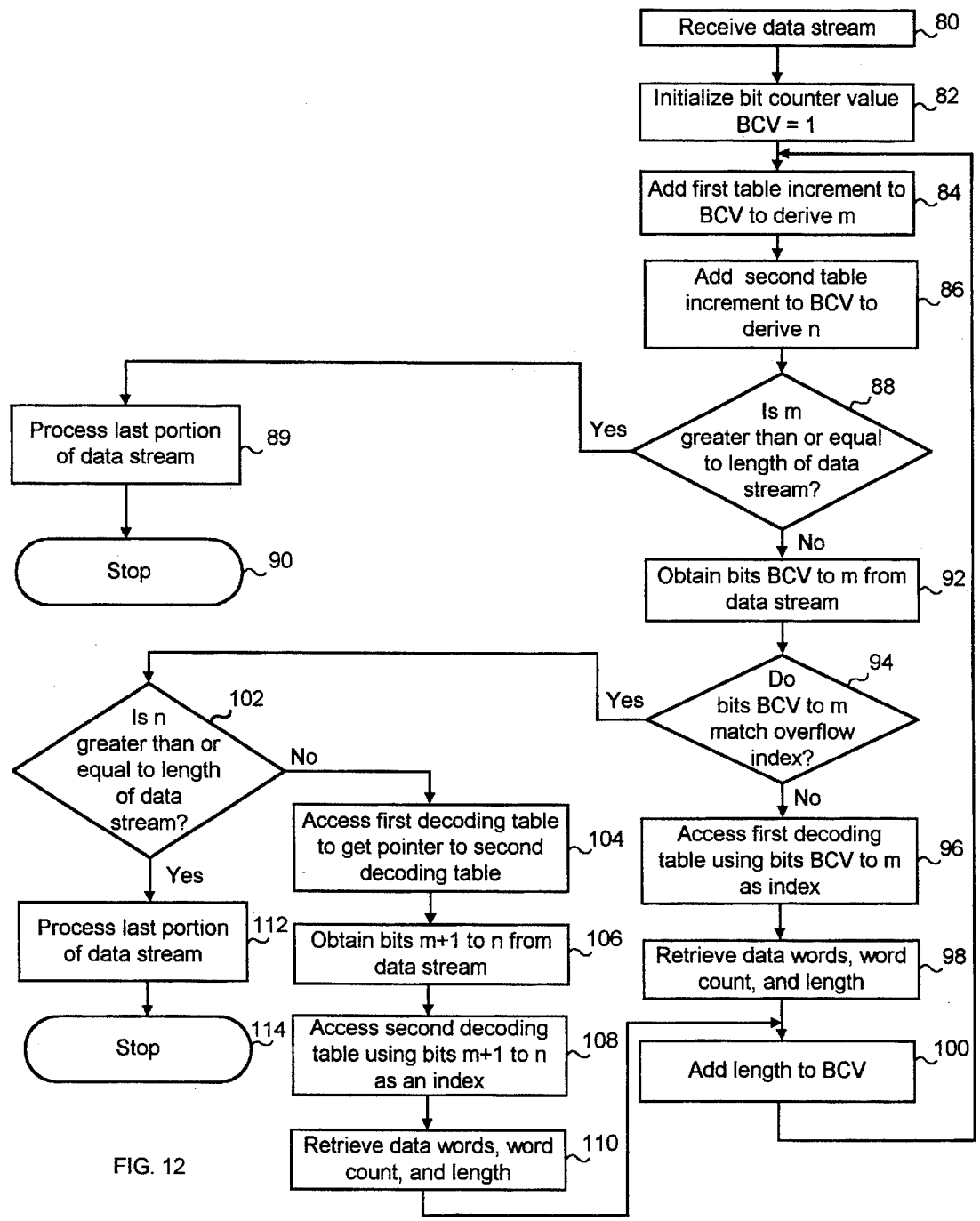
FIG. 12 is an operation flow diagram for the decoder program 68 of FIG. 11.

To illustrate how the invention may be used to perform variable length encoding, suppose that an encoding/decoding scheme uses the codebook shown in FIG. 13. Notice that in this codebook, it is the data words which vary in length (i.e. the number of symbols used to represent the data words), while the encoded data strings are constant in length. An encoding table 120 constructed in accordance with the present invention for the codebook of FIG. 13 is shown in FIG. 14. Like the tables previously described, the table of FIG. 14 preferably comprises a plurality of entries, with each entry having an index associated therewith. Each entry preferably stores at least one and preferably a plurality of data strings, a string count indicating the number of data strings contained in the entry, and a length indicating how many symbols have been decoded. The information stored in each entry preferably corresponds to the data words contained in the index to that entry. For example, the data word stream "abaa" encodes into the data strings "00", "01", and "00". Consequently, the data strings "00", "01", and "00" are stored in the entry corresponding to index "abaa".

Table 120 may be generated in substantially the same manner as table 18 of FIG. 5. Specifically, a length, in number of symbols, is first chosen for the index. Then, possible combinations of the symbols are generated to produce the indices for the table 18. Thereafter, each index is inspected for data word combinations which translate into data strings. Once these data word combinations are found, they are encoded into corresponding data strings, and these data strings are stored in the entry corresponding to the index. In addition, the number of data strings stored in the entry is recorded, and the number of symbols encoded by the data strings is recorded in the length field. Repeating this process for each index generates the table 120 shown in FIG. 14.

To illustrate how the table of FIG. 14 may be used to encode a data word stream, suppose that the stream "abacbaadcbabaaa" is to be encoded. Suppose further that four symbols are tested per decoding cycle. Testing begins with the first four symbols "abac". Applying these symbols as an index to the table of FIG. 14, the data strings "00", "01" are retrieved, along with a string count (2), and a length (3). This information indicates that three of the symbols have been encoded into the two data strings "00" and "01". Based on this information, testing continues with symbols 4–7 (cbaa). Applying these symbols as an index to the table of FIG. 14, data strings "10", "00", string count "2", and length "4" are retrieved. From this information, it is known that the symbols 4–7 have all been encoded into two data strings "10") and "00". Thus, in the next encoding cycle, testing continues with symbols 8–11. Repeating this process for four encoding cycles, the entire word stream is encoded.

Several points should be noted from this example. First, note that in the first, second, and fourth cycles, multiple data strings are retrieved. Thus, this encoding method, like the decoding methods previously described, is capable of testing for selected combinations of data words and recognizing these combinations to encode them into a plurality of encoded data strings in a single encoding cycle. Second, note that the structure of the encoding table and the encoding process are analogous to the decoding tables and decoding processes previously described. The difference is just that in this example, the table and process are used to encode rather than decode. The same principles apply to both the encoding and decoding processes.

Because the encoding process in a variable to fixed scheme is analogous to the decoding process in a fixed to variable scheme, several conclusions may be reached. First, a system similar to that shown in FIG. 6 may be used to implement the encoding process. It is just necessary to provide or generate an encoding table in accordance with the process described above, and to switch the functions of the encoder and decoder programs such that the decoder performs a straightforward lookup function and the encoder performs multiple data string, variable length encoding in accordance with the present invention. Second, multiple split-level tables may be used, just as they are in the decoding process, to minimize memory requirements in the encoding process. The split-level tables may be constructed and used in the same manner as that described above in connection with the decoding process. Third, a system similar to that shown in FIG. 11 may be used to implement the encoding process using multiple split-level tables. It is just necessary to provide or generate encoding tables in accordance with the process described above, and to switch the functions of the encoder and decoder programs such that the decoder performs a straightforward lookup function and the encoder performs multiple data string, variable length encoding. Such modifications and extensions of the invention are within the scope of the invention and within the purview of one of ordinary skill in the art.

One other type of encoding/decoding scheme in which the present invention may be implemented is a scheme wherein variable length data words are encoded into variable length data strings. To extend the present invention to such an application, the multiple data word, variable length encoding method described above is applied to perform the encoding function, and the multiple data word, variable length decoding method described above is applied to perform the decoding function. In other words, the invention is applied to both the encoding process and the decoding process instead of just one. By so doing, a variable-to-variable scheme may be effectively and efficiently implemented.

To illustrate how the invention may be implemented in a variable-to-variable scheme, suppose that the codebook shown in FIG. 15 is used. Note that both the data words and the data strings into which the data words are encoded vary in length. An encoding table 130 generated in accordance with the present invention for the codebook of FIG. 15 is shown in FIG. 16, and a decoding table 150 generated in accordance with the present invention for the same codebook is shown in FIG. 18. Tables 130 and 150 are preferably generated using substantially the same methods as those described above in connection with tables 18 and 120. One difference to note, however, is that tables 130 and 150 do not contain in the data strings and data words fields the actual strings or words corresponding to the index. Rather, fixed-length pointers P1–P8 are used. Each of these pointers P1–P8 references a specific entry in translation table 140 of FIG. 17 wherein the actual data string or data word is stored. Tables 130 and 150 are constructed in this manner because of the fact that the data strings and data words can vary in length. This length variance makes it difficult to store the actual strings or words in the tables 130, 150 themselves. Using fixed-length pointers solves the length variance problem and makes table construction much simpler. The cost for this solution is a minor one of providing an extra translation table 140.

Once generated, tables 130 and 150 may be used in much the same manner as that described above for tables 18 and 120 to encode and decode variable length data words and data strings. The only difference is that an extra table lookup step is carried out to retrieve actual data words and data strings. For example, with reference to encoding table 130, suppose that a word stream "aaba" is to be encoded. Applying this stream as an index to table 130 causes pointers P1, P1, and P2, string count "3", and length "4" to be retrieved. This information indicates that three data strings have been encoded for a word stream having four word lengths. To retrieve the actual encoded data strings corresponding to the data words, the pointers P1, P1, and P2 are applied to table 140 (FIG. 17), from which the data strings "0", "0", and "10" are retrieved. The word stream is thus encoded. Decoding is performed in a similar fashion. For example, suppose that the data stream 1000 is to be decoded. Applying this stream as an index to decoding table 150 causes pointers P6, P5, and P5 to be retrieved, along with a word count "3" and a length "4". To retrieve the actual three data words corresponding to the index 1000, the pointers P6, P5, and P5 are applied to table 140, and data words "ba", "a", and "a" are retrieved therefrom. The data stream is thus decoded.

From the above examples, it should be clear that: (1) the encoding process in a variable-to-variable scheme is quite analogous to the encoding process in a variable-to-fixed scheme; and (2) the decoding process in a variable-to-variable scheme is quite analogous to the decoding process in a fixed-to-variable scheme. Therefore, a system very similar to system 20 of FIG. 6 may be employed to implement the decoding and encoding functions in a variable-to-variable scheme. Only a few modifications need to be made. First, an extra translation table, such as table 140 of FIG. 17, is preferably stored in the working memory 30 for translating pointers into actual data words and data strings. Second, the encoding and decoding tables 32, 34 preferably take the forms of tables 130 and 150, respectively. Finally, encoder and decoder programs 26, 28, when executed by processor 22, preferably cause the processor 22 to carry out the multiword, variable length encoding and decoding methods described above, including the additional step of translating pointers to actual data words and data strings. Such a modified system will effectively and efficiently implement variable length encoding and decoding in a variable-to-variable scheme.

One additional point to note is that in variable-to-variable scheme applications where memory requirements are a concern, split-level tables may be used. Split-level encoding and decoding tables for variable length data words and data strings may be generated and used in substantially the same manner as that described above in conjunction with tables 57 and 58 (FIG. 9). Such an application is within the scope of the present invention.

Figure 19:
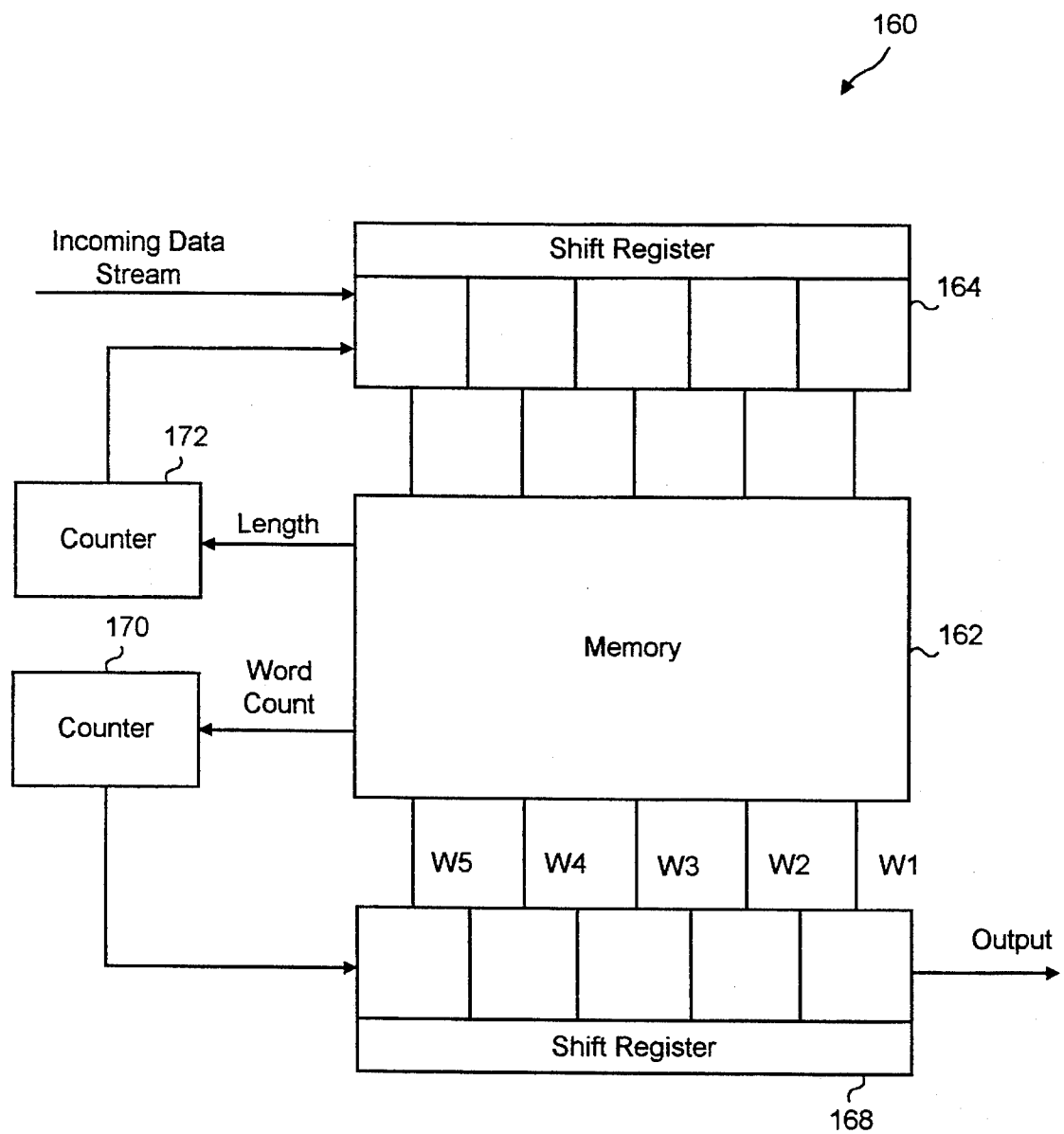
FIG. 19 is a block diagram representation of an apparatus 160 which may be implemented to carry out the encoding and decoding functions of the present invention for fixed-to-variable and variable-to-fixed encoding schemes.

The present invention has been described thus far as being implemented using software. However, if so desired, the invention may also be implemented in hardware. With reference to FIG. 19, there is shown an apparatus 160 which may be employed to perform both decoding for a fixed-to-variable scheme and encoding in a variable-to-fixed scheme. For the sake of illustration, apparatus 160 will be described only with reference to a decoding implementation. As shown in FIG. 19, apparatus 160 preferably first comprises a memory 162 for storing a decoding table generated in accordance with the present invention, such as table 18 shown in FIG. 5. Preferably, memory 162 has physical addresses which correspond to the indices of the decoding table 18. That is, memory location 00000 in memory 162 preferably stores the data words, word count, and length corresponding to index 00000, so that when 00000 is applied as an address to memory 162, the information corresponding to index 00000 is retrieved. Thus, in this hardware implementation, the index and physical address are preferably one and the same.

The memory. 162 preferably has its address inputs coupled to the parallel outputs of shift register 164. Shift register 164 acts as an input device for receiving input bits from an incoming data stream. Data bits are received on the left and are shifted to the right under the control of counter 172. Shift register 164 provides the address bits used to access the memory 162. The data outputs W1–W5 (representing data words 1–5, respectively) of memory 162 are coupled to the parallel inputs of shift register 168. In apparatus 160, shift register 168 acts as an output device for outputting selected data words under the control of counter 170. Memory 162 further provides a word count to counter 170 and a length to counter 172. These parameters are used by counters 170 and 172 to control the operation of the overall apparatus 160.

In operation, shift register 164 receives data bits from the incoming data stream. At start-up, register 164 is preferably shifted, under the control of an external control signal (not shown), a sufficient number of times to fill all of the stages of the register 164 with data bits from the data stream. Thereafter, register 164 shifts in one data bit at a time under the control of counter 172. Once register 164 is filled with data bits, register 164 sends the stored data bits in parallel to the memory 162 as address bits. In response, memory 162 decodes the address bits and retrieves the data words, word count, and length information from the location indicated by the address bits. Thereafter, memory 162 outputs the data words W1–W5 to shift register 168, the word count to counter 170, and the length to counter 172. The shift register 168 stores the data words W1–W5 therein until they are shifted out.

Counter 170 controls the shifting of register 168. Recall from previous discussion that the number of data words contained in each entry of the decoding table 18 can vary. Thus, the number of data words which should be shifted out as output will vary from entry to entry. Counter 170 ensures that the proper number of data words are outputted by receiving the word count from memory 162, and then decrementing the count until it reaches 0. With each decrement of the count counter 170 generates an output signal which causes register 168 to shift out one of the data words. By the time 0 is reached the proper number of data words will have been shifted out of register 168.

Counter 172 controls the shifting in of the data stream bits. Recall from previous discussion that the number of data bits decoded in each decoding cycle can vary. Thus, it is important to determine which bits in the data stream have and have not been decoded in any particular cycle, and to make sure that decoding continues with the proper bits.

Counter 172 performs this function. Counter 172 operates by receiving a length from memory 162 which specifies how many data bits have been decoded in the current decoding cycle. Thereafter, counter 172 uses the length as an initial count value and decrements the count until it reaches 0. With each decrement, counter 172 sends an output signal to shift register 164 which causes the register to shift in one new data bit and to shift out the rightmost data bit currently stored in the register 164. By the time 0 is reached, the data bits which were decoded in the current decoding cycle will have been shifted out of register 164 and the proper number of new bits will have been shifted in. Thus, counter 172 ensures that the proper data bits in the data stream are decoded in each decoding cycle. Operating in the manner described, the apparatus 160 properly decodes the variable length data strings contained in a data stream.

Figure 20:
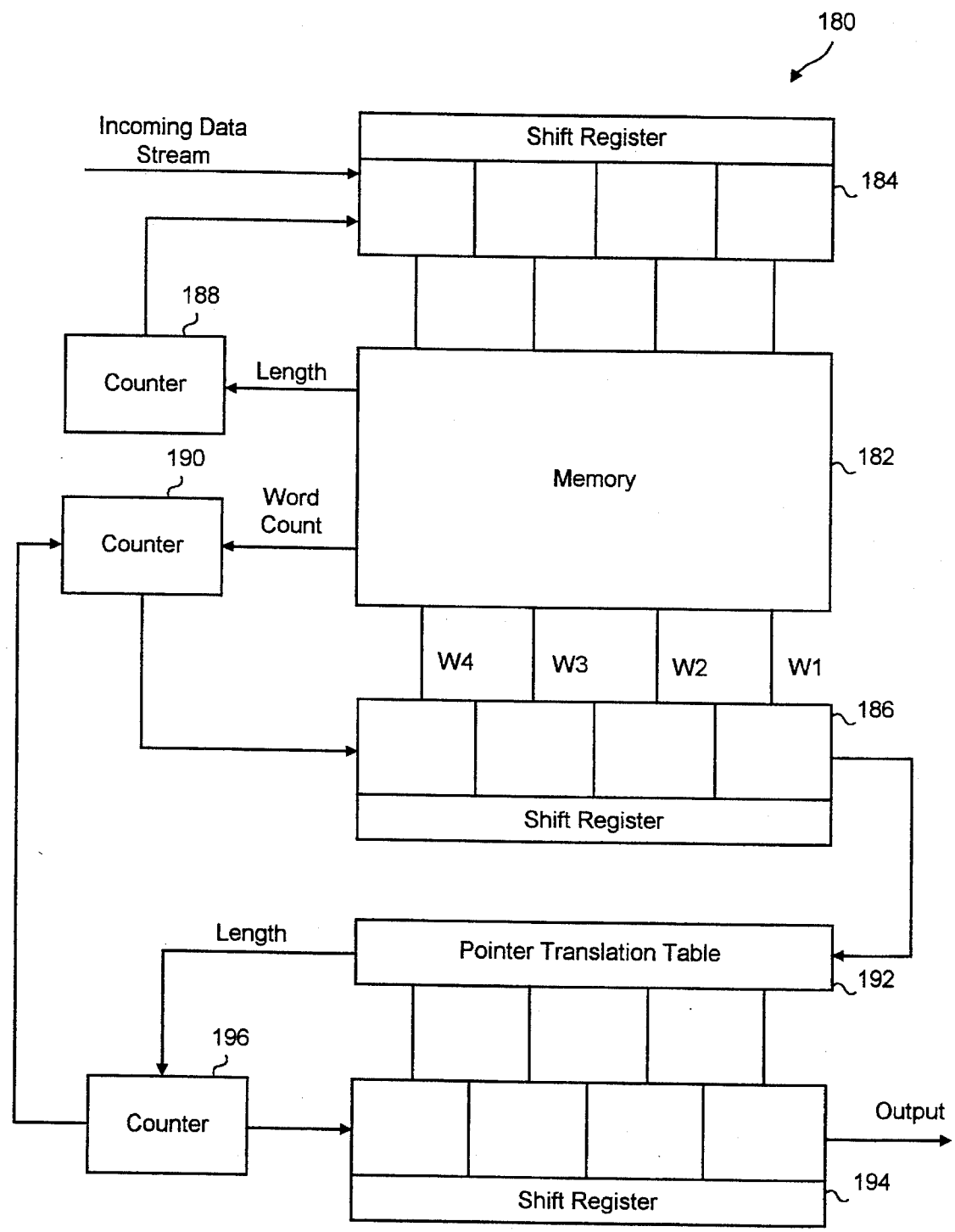
FIG. 20 is a block diagram representation of an apparatus 180 which may be implemented to carry out the encoding and decoding functions of the present invention for a variable-to-variable encoding scheme.

A hardware implementation may also be used to encode and decode data words and data strings in a variable-to-variable scheme. Such an implementation is shown in FIG. 20. Notice that the apparatus 180 in FIG. 20 is substantially the same as apparatus 160 except for the presence of the pointer translation table 192, shift register 194, and counter 196. These additional elements are included in apparatus 180 for the purpose of translating the pointers contained in the encoding and decoding tables in a variable-to-variable scheme (such as tables 130 and 150) into actual data words and data strings. The function of components 192, 194, and 196 will become more clear as apparatus 180 is described in greater detail.

As mentioned above, apparatus 180 may be used to both encode and decode variable length data words and data strings. For the sake of convenience, however, only the decoding implementation will be described herein. The corresponding encoding implementation will be made clear from this description. Apparatus 180 preferably first comprises a memory 182 for storing a decoding table constructed in accordance with the present invention, such as table 150 of FIG. 18. As with memory 162, the physical addresses of memory 182 preferably correspond to the indices of table 150 such that the addresses are equivalent to the indices. Memory 184 receives address bits from shift register 184 which, in turn, receives data bits from the incoming data stream under the control of counter 188. Memory 182 outputs information to three different components: shift register 186, counter 188, and counter 190. Shift register 186 receives the data words W1–W4 (which are actually fixed length pointers), while counters 188 and 190 receive the length and the word count, respectively.

Apparatus 180 preferably further comprises a second memory 192 which stores therein a pointer translation table, such as that shown in FIG. 17, a shift register 194, and a counter 196. Memory 192 receives the output from shift register 192 and, in response, provides a data output to shift register 194 and a length to counter 196. The shift register 194 provides the output for the apparatus 180.

In operation, apparatus 180 receives data bits from an incoming data stream through the shift register 184. The shifting in of data bits is controlled by counter 188. Data bits shifted into register 184 are passed on to the memory 182 as address bits. In response to the address bits, memory 182 retrieves data words W1–W4, a word count, and a length from the location indicated by the address bits, and outputs this information to shift register 186, counter 190, and counter 180, respectively. The counter 188 uses the length received to determine how many new data bits to shift in, and counter 190 uses the word count received to control how many data words are shifted out of shift register 186. Thus far, the operation of apparatus 180 is the same as that for apparatus 160.

A difference arises, though, when the data words W1–W4 are shifted out of register 186. Because data words W1–W4 are not actual data words but are really fixed length pointers, they do not represent the output of the apparatus 180. The actual data words need to be derived by processing the pointers. Components 192, 194, and 196 perform this processing. Specifically, memory 192 receives the output from register 192 (which is a pointer), and in response, accesses the information stored in the location indicated by the pointer. The information accessed preferably comprises a set of one or more data words and a length indicating the number of data words that are stored in that location. The data words are outputted to the shift register 194 and the length is sent to counter 196. Counter 196 thereafter uses the length received to shift out the proper number of data words as outputs. After counter 196 completes the shifting, it sends an output signal to counter 190 to indicate that counter 190 may now shift another data word from register 186 to memory 192.

Note that counters 190 and 196 cooperate in a nested loop fashion. Counter 190 acts as the outer loop and counter 196 behaves as the inner loop. Counter 190 first shifts a data word (a pointer) from register 186 to memory 192. Then, counter 196 determines how many data words should be shifted out of register 194 as output. Once counter 196 completes its shifting of register 194, then it instructs counter 190 to shift in the next pointer. In this manner, the apparatus 180 is able to handle data words which vary in length. Consequently, apparatus 180 may be effectively implemented in a variable-to-variable encoding scheme.

It should be noted here that while the invention has been described with reference to specific examples, the invention should not be construed to be so limited. Various modifications may be made by one of ordinary skill in the art with the benefit of this disclosure without departing from the spirit of the invention. Thus, the invention should not be limited by the examples used to illustrate it but only by the scope of the appended claims.

What is claimed is:

1. A method for decoding a data stream, comprising the steps of:

receiving a data stream;

testing at least a portion of said data stream to determine whether said portion contains an index comprising a plurality of data strings and associated with an entry in a table; and in response to a determination that said portion contains an index, decoding each data string contained in the index into a corresponding data word by retrieving the corresponding data words from the entry.

2. The method of claim 1, wherein said index comprises a plurality of data strings which vary in length.

3. The method of claim 1, wherein the data strings contained in said index are decoded into said corresponding data words in a single decoding cycle.

4. The method of claim 3, wherein said corresponding data words vary in length.

5. A method for encoding a word stream, comprising the steps of:

receiving a word stream;

testing at least a portion of said word stream to determine whether said portion contains an index comprising a plurality of data words and associated with an entry in a table; and in response to a determination that said portion contains an index, encoding each data word contained in the index into a corresponding data string by retrieving the corresponding data strings from the entry.

6. The method of claim 5, wherein said index comprises a plurality of data words which vary in length.

7. The method of claim 5, wherein the data words contained in said index are encoded into said corresponding data strings in a single encoding cycle.

8. The method of claim 7, wherein said corresponding data strings vary in length.

9. A method for decoding a data stream, comprising the steps of:

receiving at least a portion of a data stream, said portion comprising a plurality of data strings;

using said portion to access an entry in a table, said entry storing a plurality of decoded data words, wherein each data word corresponds to a data string in the portion; and retrieving said plurality of decoded data words from said entry, thereby decoding said plurality of data strings into said plurality of decoded data words.

10. The method of claim 9, wherein said plurality of data strings comprises data strings which vary in length.

11. The method of claim 9, further comprising the initial step of:

generating said table.

12. A method for encoding a word stream, comprising the steps of:

receiving at least a portion of a word stream, said portion comprising a plurality of data words;

using said portion to access an entry in a table, said entry storing a plurality of encoded data strings, wherein each data string corresponds to a data word in the portion; and retrieving said plurality of encoded data strings from said entry, thereby encoding said plurality of data words into said plurality of encoded data strings.

13. The method of claim 12, wherein said plurality of data words comprises data words which vary in length.

14. The method of claim 12, further comprising the initial step of:

generating said table.

15. A method for decoding a data stream, comprising the steps of:

receiving at least a portion of a data stream, said portion comprising a plurality of data strings;

using said portion to access an entry in a table, said entry storing a plurality of pointers, wherein each pointer corresponds to a data string in the portion;

using said pointers to access additional entries in a second table, said additional entries storing a plurality of decoded data words corresponding to said plurality of data strings; and retrieving said plurality of decoded data words from said additional entries, thereby decoding said plurality of data strings into said plurality of decoded data words.

16. The method of claim 15, wherein said plurality of data strings comprises data strings which vary in length.

17. The method of claim 16, wherein said plurality of decoded data words comprises decoded data words which vary in length.

18. A method for encoding a word stream, comprising the steps of:

receiving at least a portion of a word stream, said portion comprising a plurality of data words;

using said portion to access an entry in a table, said entry storing a plurality of pointers wherein each pointer corresponds to a data word in the portion;

using said pointers to access additional entries in a second table, said additional entries storing a plurality of encoded data strings corresponding to said plurality of data words; and retrieving said plurality of encoded data strings from said additional entries, thereby encoding said plurality of data words into said plurality of encoded data strings.

19. The method of claim 18, wherein said plurality of data words comprises data words which vary in length.

20. The method of claim 19, wherein said plurality of encoded data strings comprises encoded data strings which vary in length.

21. A method for generating a decoding look-up table, comprising the steps of:

generating at least one index for said table, said index being associated with a corresponding entry in said table;

inspecting said index for multiple data strings contained therein;

matching each data string contained in said index to a corresponding value from a set of selected values; and storing each corresponding value into said corresponding entry.

22. The method of claim 21, wherein said set of selected values represents multiple data words corresponding to said multiple data strings.

23. The method of claim 21, wherein said set of selected values represents multiple pointers which reference locations where multiple data words corresponding to said multiple data strings can be found.

24. A method for generating an encoding look-up table, comprising the steps of:

generating at least one index for said table, said index being associated with a corresponding entry in said table;

inspecting said index for multiple data words contained therein;

matching each data word contained in said index to a corresponding value from a set of selected values; and storing each corresponding value into said corresponding entry.

25. The method of claim 24, wherein said set of selected values represents multiple data strings corresponding to said multiple data words.

26. The method of claim 24, wherein said set of selected values represents multiple pointers which reference locations where multiple data strings corresponding to said multiple data words can be found.

27. A decoding/encoding apparatus, comprising:

a memory comprising a plurality of memory locations, each memory location having an address associated therewith, at least one of said memory, locations storing a plurality of data values, a count (x) and a length (y), said memory outputting information from a selected memory location when an address associated with the selected memory location is received;

a first shift register coupled to said memory for receiving information from an information stream and applying a selected portion of said information stream to said memory as address signals;

a second shift register coupled to said memory for receiving the data values therefrom;

a first counter coupled to said memory for receiving said length (y) therefrom, and coupled to said first shift register for providing y shift control signals thereto to cause said first shift register to shift y times; and a second counter coupled to said memory for receiving said count (x) therefrom, and coupled to said second shift register for providing x shift control signals thereto to cause said second shift register to shift out x data values as outputs.

28. A decoding/encoding apparatus, comprising:

a memory comprising a plurality of memory locations, each memory location having an address associated therewith, at least one of said memory locations storing a plurality of pointer values, a count (x) and a length (y), said memory outputting information from a selected memory location when an address associated with the selected memory location is received;

a first shift register coupled to said memory for receiving information from an information stream and applying a selected portion of said information stream to said memory as address signals;

a second shift register coupled to said memory for receiving the pointer values from said memory;

a first counter coupled to said memory for receiving said length (y) therefrom, and coupled to said first shift register for providing y shift control signals thereto to cause said first shift register to shift y times;

a second counter coupled to said memory for receiving said count (x) therefrom, and coupled to said second shift register for providing x shift control signals thereto to cause said second shift register to shift out x pointer values;

a second memory comprising a plurality of additional memory locations, each additional memory location having a pointer associated therewith, at least one of said additional memory locations storing a plurality of data values and a second length (z), said second memory outputting information from a selected additional memory location when a pointer value associated with the selected additional memory location is received from said second shift register;

a third shift register coupled to said second memory for receiving the data values therefrom; and a third counter coupled to said second memory for receiving said second length (z) therefrom, and coupled to said third shift register to provided z shift control signals thereto to cause said third shift register to shift out z data values as outputs, and coupled to said second counter to provide count signals thereto, said third counter providing a count control signal to said second counter after said third counter has sent z shift control signals to said third shift register, thereby allowing said second counter to proceed to a next count.

29. An apparatus for decoding a data stream, comprising:

means for receiving at least a portion of a data stream, said portion comprising a plurality of encoded data strings;

a memory for storing a decoding table, said decoding table having at least one entry wherein a plurality of decoded data words, each decoded data word corresponding to an encoded data string, are stored; and means for accessing said entry using said portion to retrieve said plurality of decoded data words from said entry, thereby decoding said encoded data strings.

30. The apparatus of claim 29, further comprising:

means for generating and storing said table in said memory.

31. An apparatus for encoding a word stream, comprising:
means for receiving at least a portion of a word stream, said portion comprising a plurality of data words;
a memory for storing an encoding table, said encoding table having at least one entry wherein a plurality of encoded data strings, each encoded data string corresponding to a decoded data word, are stored; and
means for accessing said entry using said portion to retrieve said plurality of encoded data strings from said entry, thereby encoding said data words.

32. The apparatus of claim 31, further comprising: means for generating and storing said table in said memory.

33. A method for decoding a data stream, comprising the steps of:
receiving a first portion and a second portion of a data stream;
using said first portion to access an overflow entry in a first table wherein an overflow pointer is stored;
locating a second table using said overflow pointer;
using said second portion to access an entry in said second table, said entry storing a plurality of decoded data words, wherein each decoded data word corresponds to a data string contained in a combination of said first and second portions; and
retrieving said plurality of decoded data words from said entry in said second table, thereby decoding the plurality of data strings contained in said combination in a single access of said second table.

34. A method for decoding a data stream, comprising the steps of:
receiving a first portion and a second portion of a data stream;
using said first portion to access an overflow entry in a first table wherein an overflow pointer is stored;
locating a second table using said overflow pointer;
using said second portion to access an entry in said second table, said entry storing a plurality of pointers, wherein each pointer corresponds to a data string contained in a combination of said first and second portions;
using said pointers to access a third table wherein a plurality of data words corresponding to the plurality of data strings contained in said combination are stored; and
retrieving said plurality of decoded data words from said third table, thereby decoding the plurality of data strings contained in said combination.

35. A method for encoding a word stream, comprising the steps of:
receiving a first portion and a second portion of a word stream;
using said first portion to access an overflow entry in a first table wherein an overflow pointer is stored;
locating a second table using said overflow pointer;
using said second portion to access an entry in said second table, said entry storing a plurality of encoded data strings, wherein each encoded data strings corresponds to a data word contained in a combination of said first and second portions; and
retrieving said plurality of encoded data strings from said entry in said second table, thereby encoding the plurality of data words contained in said combination in a single access of said second table.

36. A method for encoding a word stream, comprising the steps of:
receiving a first portion and a second portion of a word stream;
using said first portion to access an overflow entry in a first table wherein an overflow pointer is stored;
locating a second table using said overflow pointer;
using said second portion to access an entry in said second table, said entry storing a plurality of pointers, wherein each pointer corresponds to a data word contained in a combination of said first and second portions;
using said pointers to access a third table wherein a plurality of encoded data strings corresponding to the plurality of data words contained in said combination are stored; and
retrieving said plurality of encoded data words from said third table, thereby encoding the plurality of data words contained in said combination.

* * * * *